United States Patent
Chen et al.

(10) Patent No.: US 10,340,423 B2
(45) Date of Patent: Jul. 2, 2019

(54) LIGHT-EMITTING DEVICE

(71) Applicant: EPISTAR CORPORATION, Hsinchu (TW)

(72) Inventors: Chao-Hsing Chen, Hsinchu (TW);
Jia-Kuen Wang, Hsinchu (TW);
Wen-Hung Chuang, Hsinchu (TW);
Tzu-Yao Tseng, Hsinchu (TW);
Cheng-Lin Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/874,398

(22) Filed: Jan. 18, 2018

(65) Prior Publication Data

US 2018/0212110 A1   Jul. 26, 2018

Related U.S. Application Data

(60) Provisional application No. 62/450,860, filed on Jan. 26, 2017.

(51) Int. Cl.
| | |
|---|---|
| *H01L 33/00* | (2010.01) |
| *H01L 33/40* | (2010.01) |
| *H01L 33/22* | (2010.01) |
| *H01L 33/42* | (2010.01) |
| *H01L 33/62* | (2010.01) |

(Continued)

(52) U.S. Cl.
CPC ............ *H01L 33/405* (2013.01); *H01L 33/22* (2013.01); *H01L 33/42* (2013.01); *H01L 33/62* (2013.01); *F21K 9/23* (2016.08); *F21K 9/232* (2016.08); *F21K 9/69* (2016.08); *F21Y 2115/10* (2016.08); *H01L 33/0075* (2013.01); *H01L 33/06* (2013.01); *H01L 33/12* (2013.01); *H01L 33/32* (2013.01); *H01L 33/46* (2013.01); *H01L 2933/0016* (2013.01); *H01L 2933/0025* (2013.01)

(58) Field of Classification Search
USPC ......................................................... 257/98
See application file for complete search history.

(56) References Cited

U.S. PATENT DOCUMENTS

| | | | |
|---|---|---|---|
| 8,350,285 B2 * | 1/2013 | Sugizaki | H01L 33/0095 257/98 |
| 2011/0297972 A1 * | 12/2011 | Seo | H01L 25/0753 257/88 |

(Continued)

FOREIGN PATENT DOCUMENTS

WO   WO2016148424 A1 *   9/2016   ............. H01L 33/36

*Primary Examiner* — Caleb E Henry
(74) *Attorney, Agent, or Firm* — Muncy, Geissler, Olds & Lowe, P.C.

(57) ABSTRACT

A light-emitting device includes a semiconductor structure comprising a surface and a side wall inclined to the surface, wherein the semiconductor structure comprises a first semiconductor layer, a second semiconductor layer on the first semiconductor layer, and an active layer between the first semiconductor layer and the second semiconductor layer, and the second semiconductor layer comprises a first edge and a first area; and a reflective layer located on the semiconductor structure and comprising an outer edge and a second area; wherein a distance between the first edge and the outer edge is between 0 μm and 10 μm, and the second area of the reflective layer is not less than 80% of the first area of the second semiconductor layer.

20 Claims, 10 Drawing Sheets

(51) Int. Cl.
  *H01L 33/46*    (2010.01)
  *H01L 33/32*    (2010.01)
  *F21K 9/23*     (2016.01)
  *H01L 33/06*    (2010.01)
  *H01L 33/12*    (2010.01)
  *F21K 9/232*    (2016.01)
  *F21Y 115/10*   (2016.01)
  *F21K 9/69*     (2016.01)

(56) References Cited

U.S. PATENT DOCUMENTS

| | | | | |
|---|---|---|---|---|
| 2012/0251039 | A1* | 10/2012 | Shimizu | H01S 5/18311 |
| | | | | 385/14 |
| 2012/0299038 | A1* | 11/2012 | Hwang | H01L 33/385 |
| | | | | 257/98 |
| 2013/0119424 | A1* | 5/2013 | Kang | H01L 33/20 |
| | | | | 257/98 |
| 2015/0021639 | A1* | 1/2015 | Huang | H01L 33/405 |
| | | | | 257/98 |
| 2015/0108528 | A1* | 4/2015 | Chae | H01L 33/62 |
| | | | | 257/98 |
| 2015/0129919 | A1* | 5/2015 | Liu | H01L 24/19 |
| | | | | 257/98 |
| 2015/0295138 | A1* | 10/2015 | Chae | H01L 33/405 |
| | | | | 257/98 |
| 2016/0163923 | A1* | 6/2016 | Kuo | H01L 33/405 |
| | | | | 257/98 |
| 2017/0279008 | A1* | 9/2017 | You | H01L 33/405 |
| 2018/0076300 | A1* | 3/2018 | Cheng | H01L 29/66795 |

* cited by examiner

| Sample \ Parameter | $V_{f2}$(V) | $W_{d2}$(nm) | $I_{v2}$(mW) | $\Delta I_{v2}$(mW) |
|---|---|---|---|---|
| A | 3.09 | 449.77 | 914.456 | --- |
| B | 3.09 | 449.66 | 931.098 | 1.8% |

| Parameter \ Sample | C | D | E | F |
|---|---|---|---|---|
| $I_{v2}$(mW) | 990.43 | 1001.94 | 1002.37 | 1015.63 |
| $\Delta I_{v2}$(mW) | --- | 1.16% | 1.21% | 2.54% |

US 10,340,423 B2

LIGHT-EMITTING DEVICE

TECHNICAL FIELD

The application relates to a structure of a light-emitting device, and more particularly, to a light-emitting device including a semiconductor stack and a reflective layer on the semiconductor stack.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, light-emitting diodes are widely used in household appliances, equipment indicators, and optoelectronic products.

SUMMARY OF THE APPLICATION

A light-emitting device includes a semiconductor structure comprising a surface and a side wall inclined to the surface, wherein the semiconductor structure comprises a first semiconductor layer, a second semiconductor layer on the first semiconductor layer, and an active layer between the first semiconductor layer and the second semiconductor layer, and the second semiconductor layer comprises a first edge and a first area; and a reflective layer located on the semiconductor structure and comprising an outer edge and a second area; wherein a distance between the first edge and the outer edge is between 0 μm and 10 μm, and the second area of the reflective layer is not less than 80% of the first area of the second semiconductor layer.

A light-emitting device includes a semiconductor structure comprising a surface and a side wall inclined to the surface, wherein the semiconductor structure comprises a first semiconductor layer, a second semiconductor layer on the first semiconductor layer, and an active layer between the first semiconductor layer and the second semiconductor layer; a first insulating structure located on the surface and the side wall of the semiconductor structure; and a reflective layer comprising a first reflective portion and a second reflective portion separated from the first reflective portion, wherein the first reflective portion located on the second semiconductor layer and second reflective portion located on the first insulating structure.

A light-emitting device includes a semiconductor structure comprising a first semiconductor layer, a second semiconductor layer on the first semiconductor layer, and an active layer between the first semiconductor layer and the second semiconductor layer; wherein the semiconductor structure comprises an exposed part exposing the first semiconductor layer; and a second insulating layer covering the semiconductor structure; a contact layer on the second insulating layer; and a transparent conductive layer located on the second semiconductor layer and the exposed part, and between the first semiconductor layer and the contact layer.

DETAILED DESCRIPTION OF PREFERRED EMBODIMENTS

Figure 1:
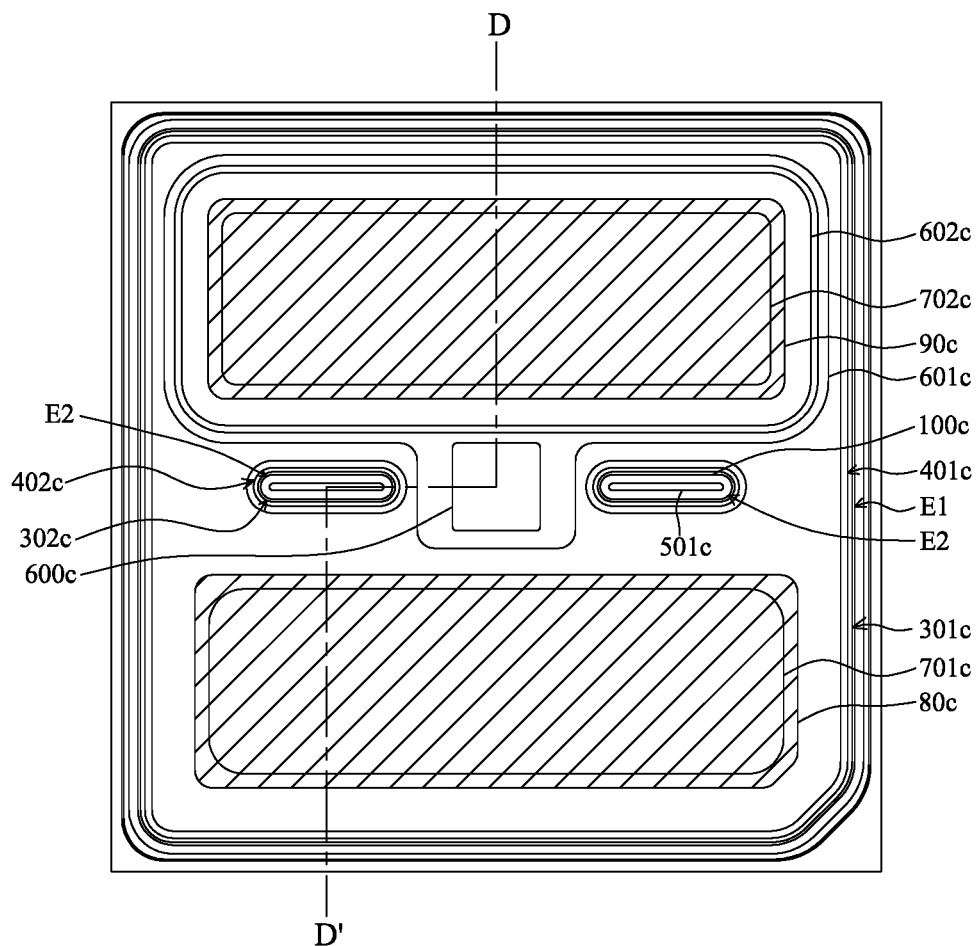
FIG. 1 illustrates a top view of a light-emitting device 1c in accordance with an embodiment of the present application.

The embodiment of the application is illustrated in detail, and is plotted in the drawings. The same or the similar part is illustrated in the drawings and the specification with the same or the similar number.

Figure 2:
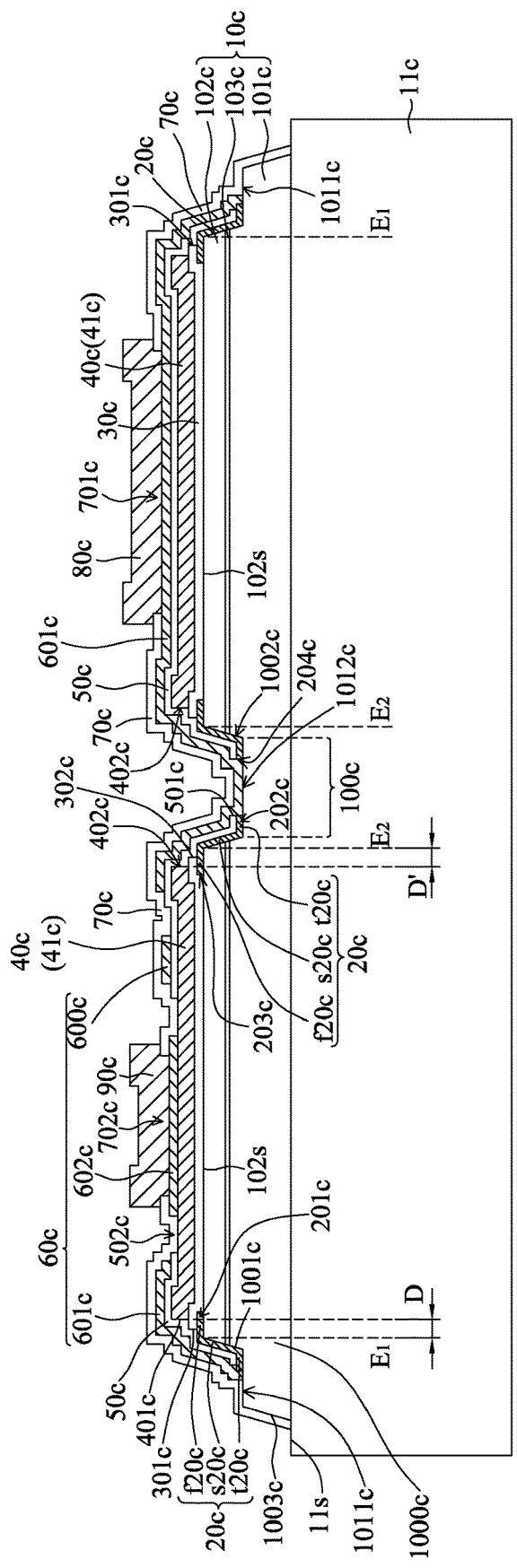
FIG. 2 illustrates a cross-sectional view of the light-emitting device 1c taken along line D-D' of FIG. 1 in accordance with an embodiment of the present application.
Figure 6A:
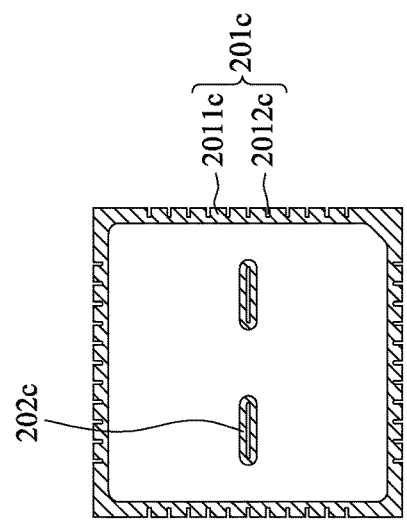
FIGS. 6A, 6B, 6B', 6C, 6C', 6D, 6E, 6E', 6F, 6G, 6H and 6I illustrate process flows of the light-emitting devices 1c, 2c in accordance with the embodiments of the present application.

FIG. 1 illustrates a top view of the light-emitting device 1c in accordance with an embodiment of the present application. FIG. 2 is a cross-sectional view of the light-emitting device 1c taken along line D-D' of FIG. 1. FIGS. 6A, 6B, 6C, 6D, 6E, 6G-6I, illustrate process flow of the light-emitting device 1c in accordance with the embodiment of the present application. The light-emitting device 1c disclosed in the present embodiment is a flip chip light-emitting diode. The light-emitting device 1c includes a substrate 11c and one or more semiconductor structures 1000c on the substrate 11c. Each of the one or more semiconductor structures 1000c includes a semiconductor stack 10c including a first semiconductor layer 101c, a second semiconductor layer 102c, and an active layer 103c between the first semiconductor layer 101c and the second semiconductor layer 102c. The active layer 103c and the second semiconductor layer 102c orderly stack on the first semiconductor layer 101c along a stacking direction. The semiconductor structure 1000c includes an exposed part exposing a part of the first semiconductor layer 101c. As shown in FIG. 2 and FIG. 6A, parts of the second semiconductor layer 102c and the active layer 103c are removed to expose the exposed part including a first surface 1011c and one or more second surface 1012c of the first semiconductor layer 101c. In one embodiment, the first surface 1011c is at an outer periphery of the one or more semiconductor structures 1000c. The first surface 1011c surrounds the second semiconductor layer 102c and the active layer 103c remaining on the substrate 11c. FIG. 6A illustrates a top view of the semiconductor structures 1000c.

In the present embodiment, the light-emitting device 1c includes only one semiconductor structure 1000c and the first surface 1011c of the first semiconductor layer 101c surrounds the second semiconductor layer 102c and the active layer 103c. Besides, in the present embodiment, the first surface 1011c is substantially located at a periphery region of the semiconductor structure 1000c. In other embodiment, the light-emitting device 1c further includes an exposed surface 11s of the substrate 11c to surround the outer periphery of the semiconductor structure 1000c. The light-emitting device 1c further includes one or more openings, such as vias 100c passing through the second semiconductor layer 102c and the active layer 103c to expose one or more second surfaces 1012c of the first semiconductor layer 101c. In one embodiment, the multiple semiconductor structures 1000c are separated by the one or more openings, such as trenches, and connected to each other by the first semiconductor layer 101c. In one embodiment (not shown), the multiple semiconductor structures 1000c are physically separated by the one or more openings without the first semiconductor layer 101c connecting. In one embodiment, the light-emitting device 1c further includes a first insulating structure 20c, a transparent conductive layer 30c, a reflective structure including a reflective layer 40c or a barrier layer 41c, a second insulating structure 50c, a contact layer 60c, a third insulating structure 70c, a first pad 80c and a second pad 90c on the one or more semiconductor structures 1000c.

In an embodiment of the present application, the substrate 11c includes a patterned surface. The patterned surface includes a plurality of projections. A shape of the projection includes taper or cone. The projection can enhance the light-extraction efficiency of the light-emitting device. In an embodiment of the present application, the substrate 11c can be a growth substrate, such as gallium arsenide (GaAs) wafer for growing aluminum gallium indium phosphide (AlGaInP), sapphire ($Al_2O_3$) wafer, gallium nitride (GaN) wafer or silicon carbide (SiC) wafer for growing gallium nitride (GaN) or indium gallium nitride (InGaN). The semiconductor stack 10c can be formed of group III nitride based compound semiconductor on the substrate 11c by metal organic chemical vapor deposition (MOCVD), molecular beam epitaxy (MBE), physical vapor deposition (PVD), hydride vapor deposition (HVPE), or ion plating, such as sputtering or evaporation. Moreover, a buffer structure (not shown) can be formed before forming the semiconductor stack 10c so as to relieve lattice mismatch between the substrate 11c and the semiconductor stack 10c and can be formed of a GaN-based material layer, such as gallium nitride or aluminum gallium nitride, or an AlN-based material layer, such as aluminum nitride. The buffer structure can be a single layer or multiple layers. The buffer structure can be formed by metal organic chemical vapor deposition (MOCVD), molecular beam epitaxy (MBE) or physical vapor deposition (PVD). The PVD method includes a sputtering method, for example, reactive sputtering method or evaporation method, such as e-beam evaporation method or thermal evaporation method. In one embodiment, the buffer structure includes an AlN buffer layer and is formed by the sputtering method. The AlN buffer layer is formed on a growth substrate with a patterned surface. The sputtering method can produce a dense buffer layer with high uniformity, and therefore the AlN buffer layer can conformably deposit on the patterned surface of the substrate 11c.

In an embodiment of the present application, the semiconductor stack 10c includes optical characteristics, such as light-emitting angle or wavelength distribution, and electrical characteristics, such as forward voltage or reverse current. In an embodiment of the present application, the first semiconductor layer 101c and the second semiconductor layer 102c, such as a cladding layer or a confinement layer, have different conductivity types, electrical properties, polarities, or doping elements for providing electrons or holes. For example, the first semiconductor layer 101c is an n-type semiconductor, and the second semiconductor layer 102c is a p-type semiconductor. The active layer 103c is formed between the first semiconductor layer 101c and the second semiconductor layer 102c. The electrons and holes combine in the active layer 103c under a current driving to convert electric energy into light energy and then light is emitted from the active layer 103c. The wavelength of the light emitted from the light-emitting device 1c is adjusted by changing the physical and chemical composition of one or more layers in the semiconductor stack 10c. The material of the semiconductor stack 10c includes a group III-V semiconductor material, such as $Al_xIn_yGa_{(1-x-y)}N$ or $Al_xIn_yGa_{(1-x-y)}P$, wherein $0 \leq x$, $y \leq 1$, and $(x+y) \leq 1$. According to the material of the active layer 103c, when the material of the semiconductor stack 10c is AlInGaP series material, red light having a wavelength between 610 nm and 650 nm or yellow light having a wavelength between 550 nm and 570 nm can be emitted. When the material of the semiconductor stack 10c is InGaN series material, blue or deep blue light having a wavelength between 400 nm and 490 nm or green light having a wavelength between 490 nm and 550 nm can be emitted. When the material of the semiconductor stack 10c is AlGaN series material, UV light having a wavelength between 400 nm and 250 nm can be emitted. The active layer 103c can be a single heterostructure (SH), a double heterostructure (DH), a double-side double heterostructure (DDH), or a multi-quantum well structure (MQW). The material of the active layer 103c can be i-type, p-type, or n-type semiconductor.

Referring to FIG. 2, in an embodiment, the semiconductor structures 1000c includes a first outside wall 1003c and a second outside wall 1001c, wherein one end of the first surface 1011c of the first semiconductor layer 101c connects the first outside wall 1003c and another end of the first surface 1011c connects the second outside wall 1001c. The second outside wall 1001c includes the side-surfaces of the first semiconductor layer 101c, the active layer 103c and the second semiconductor layer 102c. In the present embodiment, the second outside wall 1001c is composed by the side-surfaces of the first semiconductor layer 101c, the active layer 103c and the second semiconductor layer 102c. The first outside wall 1003c locates between the first surface 1011c and the substrate 11c. In one embodiment, the first outside wall 1003c and the second outside wall 1001c are inclined to the first surface 1011c of the first semiconductor layer 101c. In one embodiment, the first outside wall 1003c is inclined to the exposed surface 11s of the substrate 11c. An angle between the first outside wall 1003c and the exposed surface 11s is an acute angle. In one embodiment, an angle between the first outside wall 1003c and the exposed surface 11s is an obtuse angle.

The semiconductor stack 10c further includes an inside wall 1002c. Similar to the second outside wall 1001c, the inside wall 1002c is composed by side-surfaces of the first semiconductor layer 101c, the active layer 103c and the second semiconductor layer 102c at the via 100c. In an embodiment of the present application, the via 100c is defined by the inside wall 1002c and the second surfaces 1012c of the first semiconductor layer 101c. One end of the inside wall 1002c is connected to the second surface 1012c of the first semiconductor layer 101c and another end of the inside wall 1002c is connected to a surface 102s of the second semiconductor layer 102c. The surface 102s of the second semiconductor layer 102c is substantially perpendicular to the stacking direction. The inside wall 1002c and the second outside wall 1001c are inclined to the surface 102s of the second semiconductor layer 102c, and the inside wall 1002c is also inclined to the second surface 1012c of the first semiconductor layer 101c. An angle between the inside wall 1002c and the second surface 1012c is an acute angle or an obtuse angle, and an angle between the second outside wall 1001c and the first surface 1011c is an acute angle or an obtuse angle. The angle between the second outside wall 1001c and the surface 102s is about 100 degrees~140 degrees, similar to the angle between the inside wall 1002c and the surface 102s. Besides, the semiconductor structures 1000c further includes a first edge E1, which is an intersection of the second outside wall 1001c and the surface 102s of the second semiconductor layer 102c, and a second edge E2, which is an interconnection of the inside wall 1002c and the surface 102s of the second semiconductor layer 102c. In a top view, the second semiconductor layer 102 includes the first edge E1. More specifically, the first edge E1 is a contour of the surface 102s of the second semiconductor layer 102, and the second edge E2 is a contour of the via 100c in the top view of the light-emitting device 1c. In one embodiment, the first edge E1 or the second edge E2 is closed. In one embodiment, the second edge E2 is surrounded by the first edge E1.

Figure 6B:
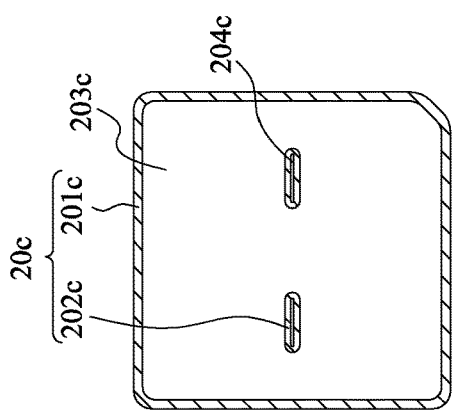

FIG. 6B illustrates a top view of the first insulating structure 20c. In an embodiment of the present application, the first insulating structure 20c of the light-emitting device 1c is formed on the semiconductor structure 1000c by sputtering or vapor deposition. As shown in FIGS. 2 and 6B, the first insulating structure 20c includes a surrounding insulating part 201c and a plurality of ring-shaped caps 202c in a top view. In the present embodiment, the surrounding insulating part 201c is disposed on an area of the semiconductor structure 1000c around the first edge E1 and the plurality of ring-shaped caps 202c is disposed on an area of the semiconductor structure 1000c around the second edge E2. In one embodiment, both of the surrounding insulating part 201c and the plurality of ring-shaped caps 202c covers a portion of the surface 102s of the second semiconductor layer 102c, the second outside wall 1001c, the inside wall 1002c of the semiconductor structure 1000c. Besides, the surrounding insulating part 201c covers a portion of the first surface 1011c, and the ring-shaped caps 202c covers a portion of the second surface 1012c. As shown in FIG. 2, the first insulating structure 20c includes a top portion f20c on the surface 102s of the second semiconductor layer 102c, a side portion s20c disposed on the second outside wall 1001c and the inside wall 1002c, and a bottom portion t20c on the first surface 1011c and the second surface 1012c of the first semiconductor layer 101c. The bottom portion t20c exposes parts of the second surface 1012c and the first surface 1011c. More specifically, the first insulating structure 20c is formed on the first surface 1011c, the second surface 1012c, the second outside wall 1001c, the inside wall 1002c and the surface 102s. The first insulating structure 20c further includes an opening 203c on the surface 102s of the second semiconductor layer 102c defined by a side surface of the top portion f20c. The first insulating structure 20c further includes another opening 204c, on the second surface 1012c, and defined by a side surface of the bottom portion t20c. The material of the first insulating structure 20c includes a non-conductive material. The non-conductive material includes organic material, inorganic material, or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone, or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$). In one embodiment, the first insulating structure 20c includes one layer or multiple layers. The first insulating structure 20c protects the sidewalls of the semiconductor stack 10c to prevent the active layer 103c from being destroyed by the following processes. When the first insulating structure 20c includes multiple layers, the first insulating structure 20c can be a distributed Bragg reflector (DBR). The DBR can protects the sidewalls of the semiconductor stack 10c, and can further selectively reflect light of a specific wavelength emitted from the active layer 103c to outside of the light-emitting device 1c to enhance brightness. Specifically, the first insulating structure 20c can be formed by alternately stacking two sub-layers, such as a $SiO_x$ sub-layer and a $TiO_x$ sub-layer. More specifically, the DBR could include a plurality pairs of sub-layers, and each sub-layer has a refractive index different from that of adjacent sub-layers. The DBR provides a high reflectivity for particular wavelength or within a particular wavelength range by setting the refractive index difference between the sub-layer with a high refractive index and the sub-layer with a low refractive index in each pair respectively. The thicknesses of two sub-layers in each pair can be different. Besides, the thicknesses of the sub-layers in the DBR with the same material can be the same or different.

Figure 6C:
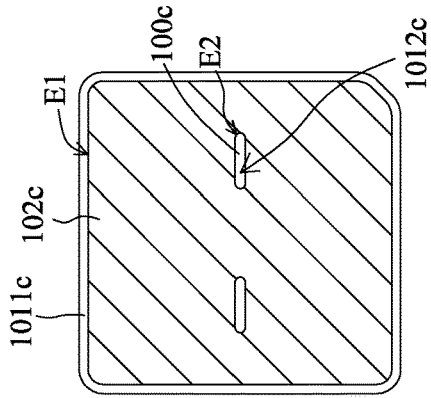
Figure 6B:
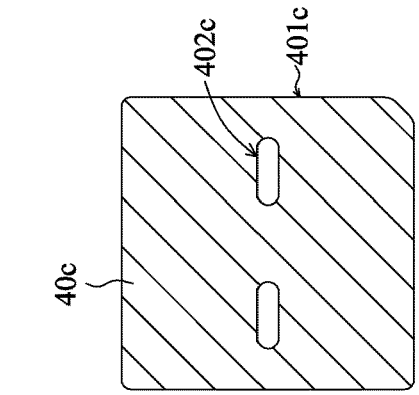
Figure 6C:
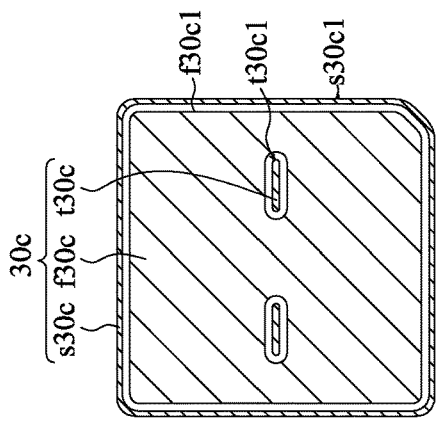

FIG. 6C illustrates a top view of the transparent conductive layer 30c. As shown in FIGS. 1, 2, and 6C, in the present embodiment, the transparent conductive layer 30c of the light-emitting device 1c is formed on the surface 102s of the second semiconductor layer 102c. In one embodiment, the transparent conductive layer 30c can further covers a part of the top portion f20c of the first insulating structure 20c. More specifically, the transparent conductive layer 30c includes a first outer edge 301c and a first inner edge 302c locates on the surface 102s of the second semiconductor layer 102c. The transparent conductive layer 30c doesn't extend beyond the first edge E1 and the second edge E2. That is, the first outer edge 301c is closer to a center of the semiconductor structure 1000c than the first edge E1 is, and the first inner edge 302c is closer to the center of the semiconductor structure 1000c than the second edge E2 is in a top view of the light-emitting device 1c as shown in FIG. 1. The first outer edge 301c is surrounded by the first edge E1 and the first inner edge 302c surrounds the second edge E2 in the top view of the light-emitting device 1c. In one embodiment, the transparent conductive layer 30c can cover the side portion s20c of the first insulating structure 20c.

The quality of the first insulating structure 20c might be affected by the process ability or stress. Some cracks might be produced in the first insulating structure 20c. In one embodiment, the transparent conductive layer 30c is located on the surface 102s and devoid of extending to cover the second outside wall 1001c and the inside wall 1002c to reduce a risk that short current occurs between the transparent conductive layer 30c and the semiconductor stack 10c caused by current leakage from the cracks of the first insulating structure 20c. Therefore, the reliability of the light-emitting device 1c can be consistent. Since the transparent conductive layer 30c is substantially formed on entire of the surface 102s of the second semiconductor layer 102c and contacts the second semiconductor layer 102c, the current can be uniformly spread throughout entire the second semiconductor layer 102c by the transparent conductive layer 30c.

The material of the transparent conductive layer 30c includes a material being transparent to the light emitted from the active layer 103c, such as metal oxide. The metal oxide includes indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO) or zinc oxide (ZnO). The transparent conductive layer 30c can be configured to form a low-resistance contact, for example, ohmic contact, with the second semiconductor layer 102c. The transparent conductive layer 30c includes a single layer or multiple layers. For example, as the transparent conductive layer 30c includes multiple sub-layers, the transparent conductive layer 30c can be a distributed Bragg reflector (DBR). In the embodiment, the DBR of the transparent conductive layer 30c is electrically conductive. In one embodiment, in a top view, a shape of the transparent conductive layer 30c substantially corresponds to a shape of the second semiconductor layer 102c. Please refer to FIGS. 6A and 6C, the shape of the transparent conductive layer 30c shown in FIG. 6C substantially corresponds to the shape of the second semiconductor layer 102c shown in FIG. 6A.

Figure 6D:
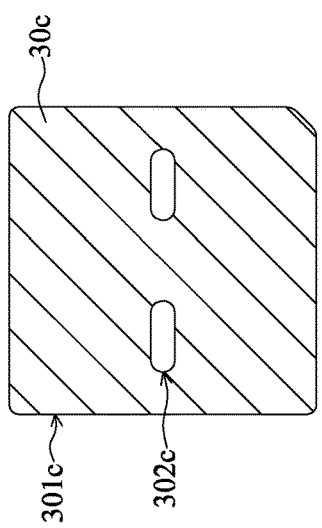

In an embodiment of the present application, the reflective structure of the light-emitting device 1c is formed on the transparent conductive layer 30c. The reflective structure includes the reflective layer 40c, the barrier layer 41c or a combination of the above. In one embodiment, in a top view, a shape of the reflective layer 40c substantially corresponds to a shape of the second semiconductor layer 102c. FIG. 6D illustrates a top view of the reflective layer 40c. As shown in FIGS. 1, 2, and 6D, the reflective layer 40c includes a second outer edge 401c and a second inner edge 402c. In the embodiment, the reflective layer 40c neither outwardly extends to exceed the first outer edge 301c and/or the first inner edge 302c of the transparent conductive layer 30c nor outwardly extends to exceed the first edge E1 and/or the second edge E2 of the semiconductor structure 1000c. The first outer edge 301c of the transparent conductive layer 30c is disposed between the second outer edge 401c of the reflective layer 40c and the first edge E1, and/or the first inner edge 302c is disposed between the second inner edge 402c and the second edge E2. In other words, the first outer edge 301c is closer to the first edge E1 than the second outer edge 401c to the first edge E1, and the first inner edge 302c is closer to the second edge E2 than the second inner edge 402c to the second edge E2. In one embodiment, the reflective layer 40c covers a part of the top portion f20c of the first insulating structure 20c, such as the top portion f20c on the surface 102s, and the reflective layer 40c is devoid of covering the side portion s20c and the bottom portion t20c. Beside, a part of the transparent conductive layer 30c near the first edge E1 and/or the second edge E2 is located between the reflective layer 40c and the top portion f20c. Specifically, the second outer edge 401c and/or the second inner edge 402c are devoid of extending to excess the first outer edge 301c and/or the first inner edge 302c respectively. In one embodiment, the transparent conductive layer 30c can avoid peeling issue between the reflective layer 40c and the first insulating structure 20c. More specifically, the reflective layer 40c connects to the first insulating structure 20c via the transparent conductive layer 30c, and the transparent conductive layer 30c disposed between them can increase the adhesion between the reflective layer 40c and the first insulating structure 20c.

In one embodiment, the second outer edge 401c is aligned to the first outer edge 301c of the transparent conductive layer 30c, and/or the second inner edge 402c is aligned to the first inner edge 302c of the transparent conductive layer 30c. In one embodiment, the second outer edge 401c is misaligned with the first edge E1 and/or the second inner edge 402c is misaligned with the second edge E2.

In one embodiment, neither the reflective layer 40c nor the transparent conductive layer 30c extends to cover the side walls, such as the second outside wall 1001c and the inside wall 1002c, of the semiconductor structure 1000c to reduce an electrical short risk in the light-emitting device 1c that is caused by current leakage through the reflective layer 40c, the transparent conductive layer 30c, and the cracks of the first insulating structure 20c to the semiconductor structure 1000c. More specifically, since the second outside wall 1001c and the inside wall 1002c are composed by the side-surfaces of the first semiconductor layer 101c, the active layer 103c and the second semiconductor layer 102c, if the reflective layer 40c extends to the second outside wall 1001c and the inside wall 1002c may cause current leakage when the first insulating structure 20c having defects or cracks. More specifically, some of metal material of the reflective layer 40c (such as silver, aluminum) may diffuse to the first semiconductor layer 101c and the second semiconductor layer 102c through the defects or cracks of the first insulating structure 20c, and therefore a short current is caused due to the electrical connection between the first semiconductor layer 101c and the second semiconductor layer 102c via the diffusion of the reflective layer 40c. Therefore, the reliability of the light-emitting device 1c would be decreased when the reflective layer 40c excesses the first edge E1 and the second edge E2 and covers the side portion s20c. However, the application will not be limited by the embodiments. Other producing methods, material of the first insulating structure 20c or structures of the first insulating structure 20c such as multiple-insulating layers can be used to improve the quality, mechanical strength of the first insulating structure 20c to prevent the current short issue.

In one embodiment, from the top view of the light-emitting device 1c, the second semiconductor layer 102c includes a first area, and the reflective layer 40c includes a second area. In the embodiment, from the top view of the light-emitting device 1c, the first area is defined by the first edge E1 and the second edge E2 of the second semiconductor layer 102c, and the second area is defined by the second outer edge 401c and the second inner edge 402c of the reflective layer 40c. The first edge E1 of the second semiconductor layer 102c surrounds the second outer edge 401c of the reflective layer 40c, and the second inner edge 402c surrounds the second edge E2 of the second semiconductor layer 102c. In order to enhance the brightness of the light-emitting device 1c, the more light emitted from the active layer 103c can be reflected by the reflective layer 40c, the more brightness can be enhanced. So the second area of the reflective layer 40c should be designed as large as possible. A tradeoff between the brightness and the reliability of the light-emitting device 1c has to be considered. In one embodiment, the second area of the reflective layer 40c is not less than 80% of the first area of the second semiconductor layer 102c. In one embodiment, the second area is 82%-96% of the first area. In one embodiment, the second area is 85%-95% of the first area.

In other embodiment, a distance D is between the second outer edge 401c of the reflective layer 40c and the first edge E1 of the semiconductor structure 1000c. A distance D' is between the second inner edge 402c and the second edge E2. In one embodiment, the distance D or the distance D' is greater than zero. In one embodiment, the distance D or the distance D' is not greater than 10 μm. In one embodiment, the distance D or the distance D' is not greater than 8 μm. In the embodiment, the distances D, D' are greater than 0 μm and less than 10 μm. In one embodiment, the distances D, D' are between 2 μm and 8 μm. Furthermore, in other embodiment, the distance D and distance D' could be the same or different.

In one embodiment, the barrier layer 41c is formed on and covers the reflective layer 40c. An outer edge (not shown) of the barrier layer 41c surrounds the second outer edge 401c of the reflective layer 40c, and/or an inner edge (not shown) of the barrier layer 41c surrounds the second inner edge 402c of the reflective layer 40c. In one embodiment, the reflective layer 40c is formed on and covers the barrier layer 41c. The outer edge of the barrier layer 41c can be surrounded by the second outer edge 401c of the reflective layer 40c, and/or the inner edge of the barrier layer 41c can be surrounded by the second inner edge 402c of the reflective layer 40c. In one embodiment, the outer edge and the inner edge of the barrier layer 41 respectively overlap or align with the second outer edge 401c and the second inner edge 402c of the reflective layer 40c.

Figure 3A:
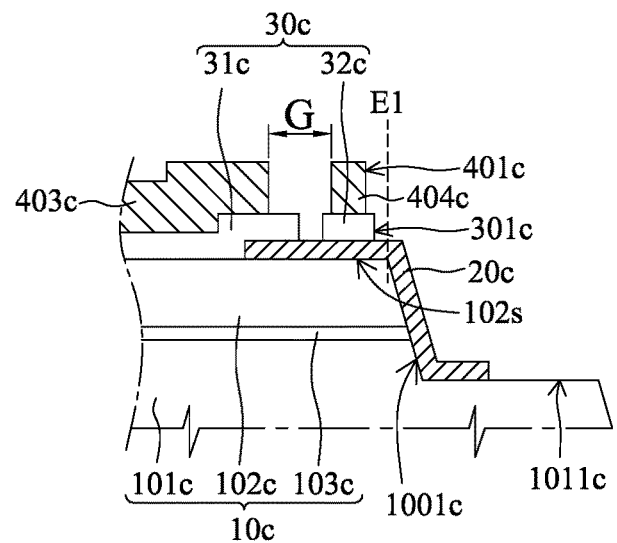
FIGS. 3A~3C respectively illustrate a partial cross-sectional view of a transparent conductive layer and a reflective layer of a light-emitting device in accordance with embodiments of the present application.
Figure 3B:
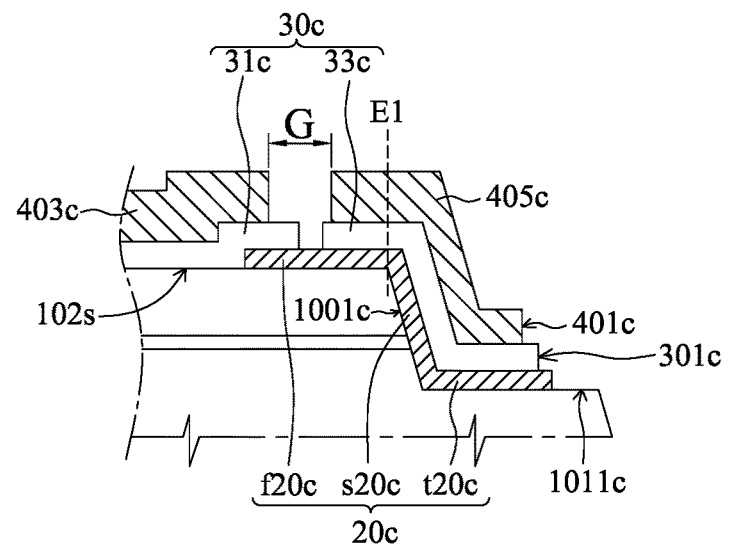
Figure 3C:
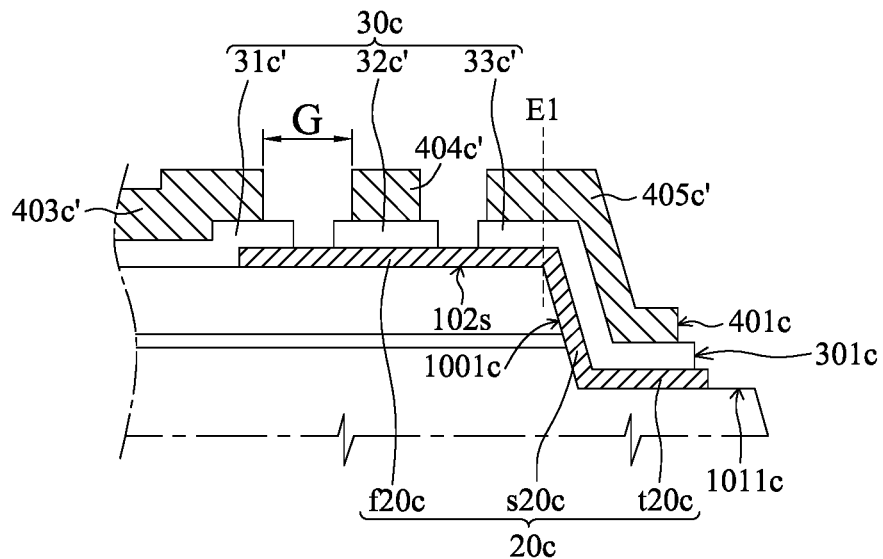

FIGS. 3A-3C respectively illustrate a partial cross-sectional view of the transparent conductive layer 30c and the reflective layer 40c near the first edge E1 or the second edge E2 of the light-emitting device 1c in accordance with embodiments of the present application. The reflective layer 40c is formed on the transparent conductive layer 30c. In one embodiment, as shown in FIG. 3A, the reflective layer 40c and the transparent conductive layer 30c are formed on the first insulating structure 20c and devoid of extending onto the sidewalls or into the via 100c of the semiconductor structure 1000c. In one embodiment, as shown in FIGS. 3B-3C, the reflective layer 40c and the transparent conductive layer 30c which are formed on the first insulating structure 20c, extend onto the sidewalls or into the via 100c of the semiconductor structure 1000c.

In one embodiment, as shown in FIG. 3A, the reflective layer 40c is a discontinuous structure and includes a first reflective portion 403c and a second reflective portion 404c separated from the first reflective portion 403c. There is a gap G between the first reflective portion 403c and the second reflective portion 404c. In one embodiment, as shown in FIG. 3A, the transparent conductive layer 30c is a discontinuous structure and includes a first conductive portion 31c and a second conductive portion 32c separated from the first conductive portion 31c. The second conductive portion 32c and the second reflective portion 404c are entirely disposed on the first insulating structure 20c and the second semiconductor layer 102c. In one embodiment, the first conductive portion 31c and the second conductive portion 32c locate under the first reflective portion 403c and the second reflective portion 404c respectively. Since the first reflective portion 403c disconnects with the second reflective portion 404c and the first conductive portion 31c disconnects with the second conductive portion 32c, and the second conductive portion 32c and the second reflective portion 404c are entirely disposed on the first insulating structure 20c, the current is unable to flow between the first reflective portion 403c and the second reflective portion 404c. That is, the second reflective portion 404c electrically disconnects to the first reflective portion 403c.

In the embodiment shown in FIG. 3B, the differences between the embodiment in FIG. 3B and the embodiment in FIG. 3A are the transparent conductive layer 30c includes a first conductive portion 31c and a third conductive portion 33c separated from the first conductive portion 31c, and the reflective layer 40c includes a first reflective portion 403c and a third reflective portion 405c separated from the first reflective portion 403c in FIG. 3B. There is a gap G between the first reflective portion 403c and the third reflective portion 405c. Therefore, the third reflective portion 405c, and the first reflective portion 403c are electrically insulated from each other. More specifically, the third conductive portion 33c is formed on the first insulating structure 20c and the second semiconductor layer 102c, and extends onto the second outside wall 1001c to cover the side portion s20c and the bottom portion t20c of the first insulating structure 20c. In one embodiment, the third conductive portion 33c is formed on the first insulating structure 20c and the second semiconductor layer 102c, and extends onto the inside wall 1002c to cover the side portion s20c of the first insulating structure 20c. The first reflective portion 403c and the third reflective portion 405c are formed on the first conductive portion 31c and the third conductive portion 33c respectively.

In one embodiment, as shown in FIG. 3C, the reflective layer 40c includes a first reflective portion 403c', a second reflective portion 404c' and a third reflective portion 405c' separated from one another. Besides, the transparent conductive layer 30c includes a first conductive portion 31c', the second conductive portion 32c' and a third conductive portion 33c' separated from one another. Therefore, the third reflective portion 405c', the second reflective portion 404c' and the first reflective portion 403c' are electrically insulated from one another. In individual light-emitting devices in accordance with the embodiments shown in FIGS. 3A-3C, each of the reflective layers 40c is the discontinuous structure and electrically disconnected, the current leakage can be avoided while the reflective layer 40c extends onto the sidewalls of the semiconductor structure 1000c to increase the second area of the reflective layer 40c. Both of the reflective area for brightness and the reliability of the individual light-emitting devices have been considered. In one embodiment, the light-emitting devices shown in FIGS. 3A-3C, the second area of the reflective layer 40c is not less than 80% of the first area of the second semiconductor layer 102c, and the distance D between the first edge E1 and the second outer edge 401c is between 0 μm and 10 μm. In one embodiment, the first outer edge 301c and the second outer edge 401c are closer to the center of the semiconductor structure 1000c than the first edge E1 in the light-emitting device shown in FIG. 3A. The first edge E1 is closer to the center of the semiconductor structure 1000c than the first outer edge 301c and the second outer edge 401c in FIGS. 3B-3C. Since the reflective layer 40c covers the sidewalls of the semiconductor structure 1000c in FIGS. 3B-3C, the second areas of the reflective layer 40c of the light-emitting device shown in FIGS. 3B-3C are larger than that shown in FIG. 3A. Besides, the second area of the reflective layer 40c shown in FIG. 3C could be larger than that shown in FIG. 3A or FIG. 3B, and thus the brightness of the light-emitting device shown in FIG. 3C can be higher than that of the light-emitting device shown in FIG. 3A or FIG. 3B.

In an embodiment of the present application, the reflective layer 40c includes multiple sub-layers, such as a Distributed Bragg reflector (DBR). In the embodiment, the material of the DBR can be electrically isolated or electrically conductive.

In an embodiment of the present application, the reflective layer 40c includes a single layer structure or a multi-layer structure, and the material of the reflective layer 40c includes a metal material with a high reflectance for the light emitted by the active layer 103c, such as silver (Ag), gold (Au), aluminum (Al), titanium (Ti), chromium (Cr), copper (Cu), nickel (Ni), platinum (Pt) or an alloy thereof. The high reflectance referred to herein means having 80% or more reflectance for a wavelength of a light emitted from the active layer 103c.

In an embodiment of the present application, the reflective structure further includes a DBR structure below the reflective layer 40c. In one embodiment, the DBR structure is formed between the semiconductor structure 1000c and the reflective layer 40c. A connecting layer can be chosen to insert between the DBR structure and the reflective layer 40c to increase the adhesion between them. For example, in the DBR structure, a first layer is connected to the reflective layer 40c, wherein the first layer includes silicon oxide (SiO$_2$) and the reflective layer 40c includes silver (Ag). The connecting layer therebetwen includes ITO, IZO or the other similar material has higher adhesion to the reflective layer 40c than the first layer of the DBR structure has.

In an embodiment of the present application, the reflective structure further includes the barrier layer 41c, which covers the reflective layer 40c to prevent the surface of the reflective layer 40c from being oxidized that deteriorates the reflectivity of the reflective layer 40c. The material of the barrier layer 41c includes metal material, such as titanium (Ti), tungsten (W), aluminum (Al), indium (In), tin (Sn), nickel (Ni), platinum (Pt), zinc (Zn), chromium (Cr) or an alloy of the above materials. The barrier layer 41c can include a single layer structure or a multi-layer structure. When the barrier layer 41c is the multi-layer structure, the barrier layer 41c is alternately stacked by a first barrier layer (not shown) and a second barrier layer (not shown), for example, Cr/Pt, Cr/Ti, Cr/TiW, Cr/W, Cr/Zn, Ti/Pt, Ti/W, Ti/TiW, Ti/W, Ti/Zn, Pt/TiW, Pt/W, Pt/Zn, TiW/W, TiW/Zn, or W/Zn. In one embodiment, the material of the barrier layer 41c includes a metal material other than gold (Au) or copper (Cu).

Figure 6E:
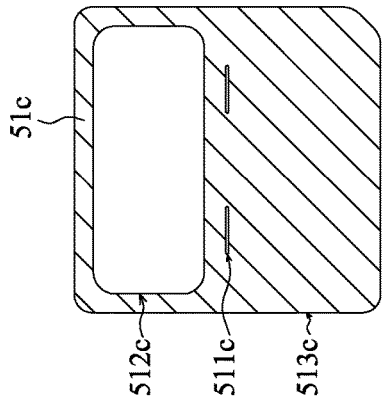

In an embodiment of the present application, the second insulating structure 50c of the light-emitting device 1c is formed on the semiconductor structure 1000c by sputtering or vapor deposition. The second insulating structure 50c is formed on the semiconductor structure 1000c, the first insulating structure 20c, the transparent conductive layer 30c and the reflective layer 40c. FIG. 6E. illustrates a top view of the second insulating structure 50c. As shown in FIGS. 1, 2, and 6E, the second insulating structure 50c includes one or multiple first insulating openings 501c to expose the second surface 1012c of the first semiconductor layer 101c, and one or multiple second insulating openings 502c to expose the reflective layer 40c or the barrier layer 41c. In an embodiment, the first insulating openings 501c and the second insulating openings 502c include different widths or numbers. From the top view of the light-emitting device 1c, the shapes of the first insulating openings 501c and the second insulating openings 502c include circular, elliptical, rectangular, polygonal, or arbitrary shapes. In one embodiment, the positions of the first insulating openings 501c are formed to correspond to the positions of the vias 100c. In the embodiment, the one second insulating openings 502c is at one side of the light-emitting device 1c opposite to the first insulating openings 501c.

The second insulating structure 50c is formed of a non-conductive material and includes organic material, inorganic material or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone, or glass. The dielectric material includes aluminum oxide (Al$_2$O$_3$), silicon nitride (SiN$_x$), silicon oxide (SiO$_x$), titanium oxide (TiO$_x$), or magnesium fluoride (MgF$_x$). In one embodiment, the second insulating structure 50c includes one layer or multiple layers. In one embodiment, the second insulating structure 50c can be a distributed Bragg reflector (DBR). Specifically, the second insulating structure 50c can be formed by alternately stacking a SiO$_x$ sub-layer and a TiO$_x$ sub-layer. The material of the second insulating structure 50c and that of the first insulating structure 20c can be the same or different.

Figure 6F:
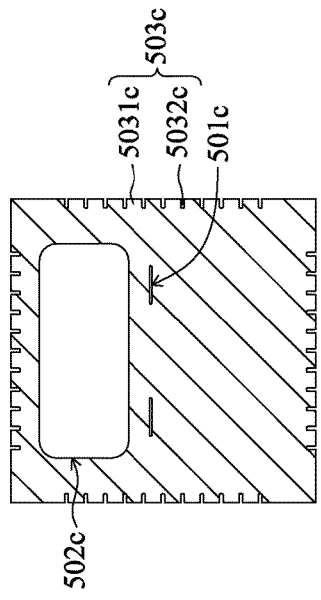
Figure 6I:
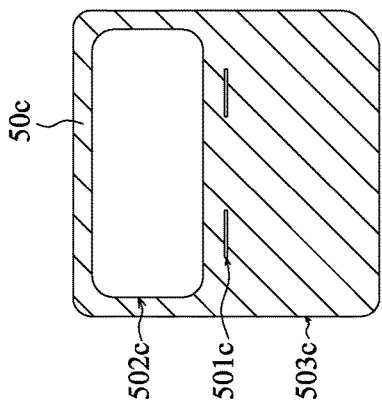
Figure 6E:
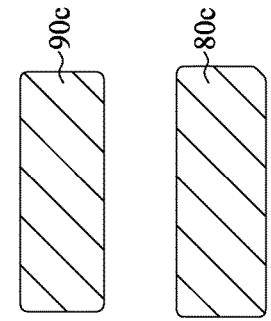
Figure 6H:
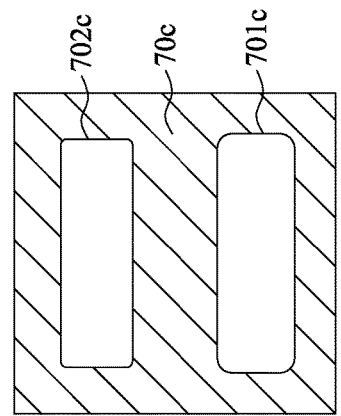
Figure 6G:
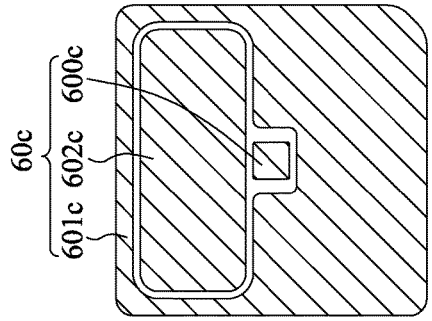

FIG. 6G. illustrates a top view of the contact layer 60c. As shown in FIGS. 1, 2, and 6G, in one embodiment, the contact layer 60c is formed on the second insulating structure 50c and the reflective layer 40c or on the barrier layer 41c. The contact layer 60c includes a first contact part 601c, a second contact part 602c, and a pin region 600c electrically separated from one another. Herein, the first contact part 601c is electrically connected to the first semiconductor layer 101c, the second contact part 602c is electrically connected to the second semiconductor layer 102c and the pin region 600c is electrically isolated from the first contact part 601c and the second contact part 602c. The first contact part 601c is formed on the first surface 1011c of the first semiconductor layer 101c to surround a periphery of the semiconductor structure 1000c and contact the first semiconductor layer 101c to form an electrical connection. In one embodiment, first contact part 601c includes a peripheral length larger than a peripheral length of the active layer 103c. In one embodiment, the first contact part 601c is also formed on the second surfaces 1012c of the first semiconductor layer 101c to cover the one or multiple vias 100c via the plurality of first insulating openings 501c of the second insulating structure 50c and contact the first semiconductor layer 101c to form an electrical connection. The pin region 600c is deposited on the second semiconductor layer 102c, and electrically isolated from the first semiconductor layer 101c and the second semiconductor layer 102c by the second insulating structure 50c. In the present embodiment, the pin region 600c is substantially deposited at the center of the light-emitting device 1c from the top-view. Additionally, the second contact part 602c electrically connects the surface 102s of the second semiconductor layer 102c via the reflective layer 40c and the transparent conductive layer 30c to form an electrical connection between the second contact part 602c and the second semiconductor layer 102c. In the present embodiment, from the top-view of the light-emitting device 1c, the pin region 600c is located between the first contact part 601c and the second contact part 602c. The pin region 600c and the second contact part 602c are surrounded by the first contact part 601c as shown in FIG. 6G. In one embodiment, the pin region 600c is electrically connected to one of the first contact part 601c or the second contact part 602c. A shape of the pin region 600c in a top-view includes a geometric shape, for example, a rectangle or a circle. The contact layer 60c can be a single layer structure or a multi-layer structure. The material of the contact layer 60c includes metal such as aluminum (Al), silver (Ag), chromium (Cr), platinum (Pt), nickel (Ni), titanium (Ti), tungsten (W), or zinc (Zn).

After the contact layer 60c is formed, a third insulating structure 70c is disposed on the contact layer 60c and covers the contact layer 60c. FIG. 6H. illustrates a top view of the third insulating structure 70c. As shown in FIGS. 1, 2, and 6H, the third insulating structure 70c includes a first opening 701c and a second opening 702c. The first opening 701c exposes the first contact part 601c of the contact layer 60c, and the second opening 702c exposes the second contact part 602c of the contact layer 60c. The third insulating structure 70c includes one layer or multiple layers. When the third insulating structure 70c includes multiple layers, the third insulating structure 70c can form a Distributed Bragg reflector (DBR). A material of the third insulating structure 70c includes non-conductive material which includes organic materials, inorganic materials or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone, or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$). The first insulating structure 20c, the second insulating structure 50c, and the third insulating structure 70c can be the same material or different materials selected from the materials described above. The first insulating structure 20c, the second insulating structure 50c, and the third insulating structure 70c can be formed by printing, evaporation or sputtering.

After the third insulating structure 70c is formed, the first pad 80c and the second pad 90c are formed on the semiconductor stack 10c. FIG. 6I. illustrates a top view of the first pad 80c and the second pad 90c. As shown in FIGS. 1, 2, and 6I, the positions and/or shapes of the first pad 80c and the second pad 90c also respectively correspond to those of the first opening 701c and the second opening 702c of the third insulating structure 70c. The first pad 80c is electrically connected to the first semiconductor layer 101c through the first opening 701c of the third insulating structure 70c and the first contact part 601c of the contact layer 60c, and the second pad 90c is electrically connected to the second semiconductor layer 102c through the second opening 702c of the third insulating structure 70c, the second contact part 602c of the contact layer 60c, the reflective layer 40c and the transparent conductive layer 30c. In the top view of the light-emitting device 1c, the first pad 80c includes the same shape as that of the second pad 90c, for example, the first pad 80c and the second pad 90c include rectangular shape, but the present disclosure is not limited hereto. In other embodiment, the shape or the size of the first pad 80c can be different from that of the second pad 90c for recognizing the first pad 80c and the second pad 90c or for producing a good current spreading in the light-emitting device 1c. For example, the shape of the first pad 80c can be rectangular, and the shape of the second pad 90c is comb-shaped, and the area of the first pad 80c is larger than that of the second pad 90c. In the embodiment, the first pad 80c and the second pad 90c includes a structure having one or more layers. Materials of the first pad 80c and the second pad 90c include metal materials, such as chromium (Cr), titanium (Ti), tungsten (W), aluminum (Al), indium (In), tin (Sn), nickel (Ni), platinum (Pt), or an alloy of the above materials. When the first pad 80c and the second pad 90c include a multi-layer structure, the first pad 80c and the second pad 90c includes an upper pad and a lower pad (not shown) respectively. The upper pad and the lower pad have different functions. The function of the upper pad is used for soldering or wiring. The light-emitting device 1c can be flipped and mounted on a package substrate (not shown) by using solder bonding or AuSn eutectic bonding through the upper pad. The metal material of the upper pad includes highly ductile materials such as nickel (Ni), cobalt (Co), iron (Fe), titanium (Ti), copper (Cu), gold (Au), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru) or osmium (Os). The upper pad can be a single layer, or a multilayer film of the above materials. In an embodiment of the present application, the material of the upper pad preferably includes nickel (Ni) and/or gold (Au), or an alloy thereof. The function of the lower pad is for forming a stable interface with the contact layer 60c, the reflective layer 40c, or the barrier layer 41c, for example, improving the interface bonding strength between the lower pad and the contact layer 60c, or enhancing the interface bonding strength between the lower pad of the second pad 90c and the reflective layer 40c or the barrier layer 41c. Another function of the lower pad is to prevent material of the solder, such as tin (Sn), or AuSn from diffusing into the reflective structure and damaging the reflectivity of the reflective structure. Therefore, the lower pad can include metal materials different from the upper pad. That is, the material of the lower pad include the material other than gold (Au) and copper (Cu), such as nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os). The lower pad can be a single layer, an alloy, or a multilayer film of the above materials. In an embodiment of the present application, the lower pad preferably includes a multilayer film of titanium (Ti) and aluminum (Al), or a multilayer film of chromium (Cr) and aluminum (Al).

Figure 3D:
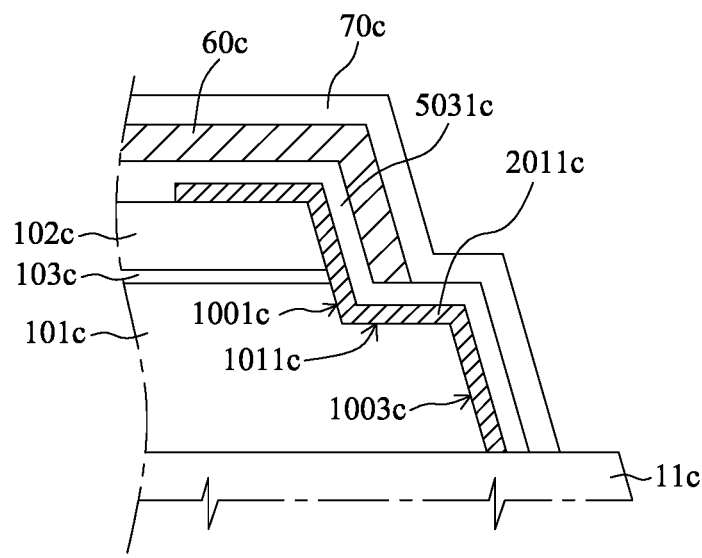
FIG. 3D illustrates a partial cross-sectional view of a light-emitting device in accordance with an embodiment of the present application.

FIGS. 6A, 6B', 6C-6D, 6E', 6G-6I, illustrate process flow of the light-emitting device in accordance with another embodiment of the present application. The main differences between the light-emitting device in the present embodiment and the light-emitting device 1c are the structures of the first insulating structure 20c and the second insulating structure 50c. Please refer to FIG. 6B', the first insulating structure 20c includes a surrounding insulating part 201c and a plurality of ring-shaped caps 202c. Herein, the surrounding insulating part 201c includes a plurality of protrusions 2011c and a plurality of recesses 2012c. In the embodiment, the plurality of protrusions 2011c and the plurality of recesses 2012c of the surrounding insulating part 201c are alternately arranged. FIG. 3D illustrates a partial cross-sectional view at one of the protrusions 2011c of the light-emitting device in accordance with the present embodiment. As shown in FIGS. 3D and 6B', the surrounding insulating part 201c is disposed along the first surface 1011c and surrounds the semiconductor structure 1000c. In the embodiment, the plurality of protrusions 2011c and the plurality of recesses 2012c of the surrounding insulating part 201c are alternately arranged on the first surface 1011c. Specifically, the plurality of protrusions 2011c extends from the surface 102s of the second semiconductor layer 102c and covers portions of the first surface 1011c of the semiconductor structure 1000c, and the plurality of recesses 2012c exposes other portions of the first surface 1011c. In other words, the first surface 1011c includes a first exposed area exposed by the surrounding insulating part 201c, and the first exposed area is discontinuous.

Figures 4A, 4B, 5:
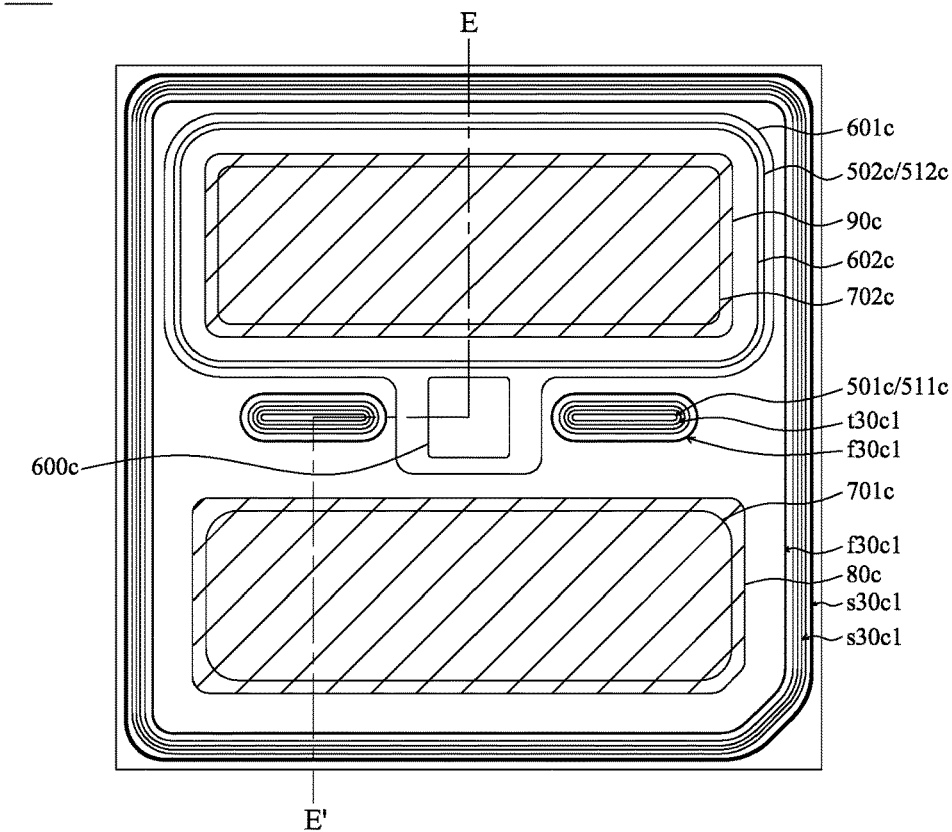
FIG. 4A illustrates a table listing characteristics of samples A~B.
FIG. 4B illustrates a table listing characteristics of samples C~F.
FIG. 5 illustrates a top view of a light-emitting device 2c in accordance with an embodiment of the present application.

Please refer to FIG. 6E', the second insulating structure 50c includes a periphery 503c including a plurality of protrusions 5031c and a plurality of recesses 5032c in the present embodiment. As shown in FIG. 3D, the second insulating structure 50c covers the first insulating structure 20c, so that the second outside wall 1001c and a portion of the first surface 1011c which is covered by the first insulating structure 20c are also covered by the second insulating structure 50c. Additionally, the plurality of protrusions 5031c and the plurality of recesses 5032c of the second insulating structure 50c are arranged alternately along the first surface 1011c of the semiconductor structure 1000c. Moreover, in the embodiment, a shape of the periphery 503c of second insulating structure 50c corresponds to a shape of a periphery of the first insulating structure 20c for discontinuously exposing the first surface 1011c of the semiconductor structure 1000c. More specifically, shapes and positions of the plurality of protrusions 5031c and the plurality of recesses 5032c respectively correspond to shapes and positions of the plurality of protrusions 2011c and the plurality of recesses 2012c of the surrounding insulating part 201c. In such manner, the first surface 1011c exposed by the plurality of recesses 2012c of the first insulating structure 20c can be also exposed by the plurality of recesses 5032c of the second insulating structure 50c. The first surface 1011c covered by the plurality of protrusions 2011c can be covered by the plurality of protrusions 5031c. In other words, the first surface 1011c includes a second exposed area exposed by the plurality of recesses 5032c, and the second exposed area is discontinuous. The second exposed area of the first surface 1011c substantially corresponds to the first exposed area exposed by the first insulating structure 20c. Please refer to FIG. 6G, in the embodiment, the first contact part 601c is electrically connected to the first semiconductor layer 101c by contacting the first surface 1011c via the plurality of recesses 5032c of the second insulating structure 50c and the plurality of recesses 2012c of the first insulating structure 20c. In other words, the first contact part 601c includes a discontinuous contact region (not shown) contact the first surface 1011c. In the embodiment, the discontinuous contact region between the first contact part 601c and the first surface 1011c of the semiconductor structure 1000c benefits current spreading of the light-emitting device and avoid breakdown of the light-emitting device. Please refer to FIG. 4A. FIG. 4A shows a table listing the characteristics of samples A~B. More specifically, the table shows the characteristics of a conventional light-emitting device (sample A) and the light-emitting device 1c in one embodiment of the present application (sample B). Sample A and sample B include the same shape, which is square, and the same chip size, which is 35×35 mil². The differences are the area of the reflective layer of the conventional light-emitting device is smaller than the reflective layer 40c of the light-emitting device 1c. On the other hand, in the conventional light-emitting device, the distance between the first edge of the second semiconductor layer and the second outer edge of the reflective layer is 15 The distance D of the light-emitting device 1c in the embodiment is 6 The distance D of the light-emitting device 1c is smaller than the distance of the conventional light-emitting device. In other words, the area of the reflective layer 40c of the light-emitting device 1c is larger than that of the reflective layer of the conventional light-emitting device. A ratio of the area of the reflective layer 40c to the area of the second semiconductor layer 102c of the light-emitting device 1c is larger than a ratio of the area of the reflective layer to the area of the second semiconductor layer of the conventional light-emitting device. The table indicates that, the power ($I_{V2}$) of the light-emitting device 1c is enhanced by 1.8% ($\Delta I_{V2}$) compared with that of the conventional light-emitting device, while the forward voltage ($V_{f2}$) and the wavelength ($W_{d2}$) are kept at the same levels. Therefore, the reflective layer 40c with a larger area can enhance the performance of the light-emitting device 1c.

Please refer to FIG. 4B. FIG. 4B shows a table listing the characteristics of samples C~F. More specifically, the table shows the performances of the samples C~F. Sample C is a conventional light-emitting device. Sample D is a light-emitting device with the contact layer 60c including the discontinuous contact region as shown in FIGS. 6B' 6E' and 3D but without a larger second area of the reflective layer 40c as shown in FIGS. 1~2. Sample E is the light-emitting device 1c with a larger second area of the reflective layer 40c as shown in FIGS. 1~2. Sample F is the light-emitting device including the contact layer 60c with the discontinuous contact region shown in FIGS. 6B', 6E' and 3D, and the reflective layer 40c with the larger second area as shown in FIGS. 1~2, which combined the designed features in sample D and sample E. Both of sample D and sample E have more advanced performance in the brightness compared with sample C. Moreover, the light-emitting device, sample F, has a highest power ($I_{V2}$).

Figure 7:
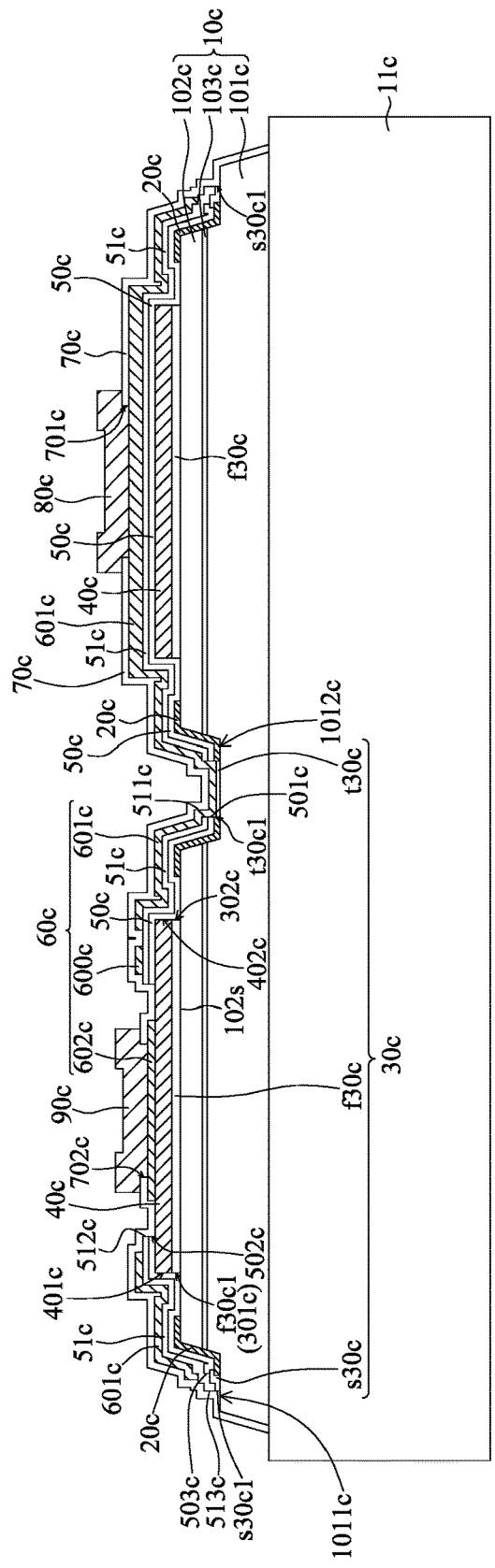
FIG. 7 illustrates a cross-sectional view of the light-emitting device 2c taken along line E-E' of FIG. 5 in accordance with an embodiment of the present application.

FIG. 5 illustrates a top view of a light-emitting device 2c in accordance with an embodiment of the present application. FIG. 7 is a cross-sectional view of the light-emitting device 2c taken along line E-E 'of FIG. 5. FIGS. 6A-6B, 6C', 6D, 6E-6I respectively show the layouts of the semiconductor structure 1000c with the exposed first surface 1011c and the second surface 1012c of first semiconductor layer 101c, the first insulating structure 20c, the transparent conductive layer 30c, the reflective layer 40c, the second insulating structure 50c, an adhesion layer 51c, the contact layer 60c, the third insulating structure 70c and the pads 80c, 90c of the light-emitting device 2c. The light-emitting device 2c in the embodiment is similar to the light-emitting device 1c shown in FIGS. 1~2. The difference is the light-emitting device 2c further includes the adhesion layer 51c between the second insulating structure 50c and the contact layer 60c. Besides, the transparent conductive layer 30c of the light-emitting device 2c further includes a first transparent conductive portion f30c, a second transparent conductive portion s30c and a third transparent conductive portion t30c separated from one another different from the transparent conductive layer 30c of the light-emitting device 1c. In one embodiment, the material of the second insulating structure 50c includes silicon oxide ($SiO_2$) and the material of the contact layer 60c includes silver (Ag), the adhesion layer 51c between the second insulating structure 50c and the contact layer 60c can enhance the adhesion between the second insulating structure 50c and the contact layer 60c. The adhesion layer 51c can prevent the contact layer 60c peeling from the second insulating structure 50c. Inserting the adhesion layer 51c therebetween benefits the reliability of the light-emitting device 2c. The adhesion layer 51c includes a material which has higher adhesion with the second insulating structure 50c than that between the contact layer 60c and the second insulating structure 50c. The material of the adhesion layer 51c can be transparent conductive material or metal. The transparent conductive material includes metal oxide. The metal oxide includes indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO) or zinc oxide (ZnO). The metal includes Pt. However, the material of the adhesion layer 51c is not limited to the above material. In one embodiment, a shape and an area of the adhesion layer 51c shown in FIG. 6F is similar to that of the second insulating structure 50c shown in FIG. 6E. More specifically, the adhesion layer 51c includes one or multiple first adhesion openings 511c corresponding to the first insulating openings 501c and one or multiple second adhesion openings 512c corresponding to the second insulating openings 502c. In one embodiment, a periphery 513c of the adhesion layer 51c surrounds a periphery 503c of the second insulating structure 50c for electrically connecting to the first surface 1011c of the first semiconductor layer 101c. In the embodiment, the adhesion layer 51c extends onto the exposed part of the semiconductor structure 1000c. More specifically, the adhesion layer 51c extends onto the first surface 1011c and/or the second surface 1012c as shown in FIG. 7.

Please refer to FIG. 6C' and FIG. 7, in the embodiment, the first transparent conductive portion f30c is located on the surface 102s of the second semiconductor layer 102c, the second transparent conductive portion s30c is located on the first surface 1011c of the exposed part, and the third transparent conductive portion t30c is located on the second surface 1012c of the exposed part in the via 100c. The transparent conductive layer 30c connects to the adhesion layer 51c on the exposed part. The third transparent conductive portion t30c is surrounded by the first transparent conductive portion f30c, and the first transparent conductive portion f30c is surrounded by the second transparent conductive portion s30c in a top view of the transparent conductive layer 30c as shown in FIG. 6C'. The area of the first transparent conductive portion f30c is larger than the second transparent conductive portion s30c and the third transparent conductive portion t30c. More specifically, the first transparent conductive portion f30c includes a first periphery f30c1, the second transparent conductive portion s30c includes a second periphery s30c1 surrounding the first periphery f30c1, and the third transparent conductive portion t30c includes a third periphery t30c1 surrounded by the first periphery f30c1 in the top view.

As shown in FIGS. 6D and 7, the reflective layer 40c formed on the first transparent conductive portion f30c. The reflective layer 40c includes a second outer edge 401c and a second inner edge 402c surrounded by the second outer edge 401c. The reflective layer 40c neither outwardly extends to exceed the first outer edge 301c and/or the first inner edge 302c of the transparent conductive layer 30c nor outwardly extends to exceed the first edge E1 and/or the second edge E2 of the semiconductor structure 1000c. In the present embodiment, the second outer edge 401c is substantially aligned to the first outer edge 301c, and the second inner edge 402c is substantially aligned to the first inner edge 302c. As shown in FIGS. 6E and 7, the second insulating structure 50c is formed on the reflective layer 40c, and covers the first insulating structure 20c. In one embodiment, the second insulating structure 50c including the plurality of protrusions 5031c and the plurality of recesses 5032c as shown in FIG. 6E' are located on the exposed part of the semiconductor structure 1000c and covers the first surface 1011c or the transparent conductive layer 30c shown in FIGS. 6C and 6C'. More specifically, the plurality of protrusions 5031c and the plurality of recesses 5032c are arranged alternately along the first surface 1011c, and discontinuously covers the first surface 1011c. More specifically, the plurality of protrusions 5031c covers portions of the first surface 1011c which is covered by the plurality of protrusions 2011c, and the plurality of recesses 5032c exposes portions of the first surface 1011c which is exposed by the plurality of recesses 2012c. In one embodiment, the plurality of protrusions 5031c covers portions of the second transparent conductive portion s30c and the plurality of recesses 5032c exposes portions of the second transparent conductive portion s30c.

Please refer to FIG. 6G, similar to the light-emitting device 1c, the light-emitting device 2c includes the contact layer 60c having the first contact part 601c, the second contact part 602c and the pin region 600c. The first contact part 601c electrically connects to the first semiconductor layer 101c through the first adhesion opening 511c, the first insulating openings 501c and the second transparent conductive portion s30c disposed on the first surface 1011c and the third transparent conductive portion t30c disposed on the second surface 1012c in the vias 100c. On the other hand, the second contact part 602c electrically connects to the second semiconductor layer 102c through the second adhesion openings 512c, and the second insulating openings 502c, the reflective layer 40c and the first transparent conductive portion f30c disposed on the surface 102s of the second semiconductor layer 102c. In one embodiment, the material of the first contact part 601c and the second contact part 602c are the same and both of them are multi-layer structure.

In one embodiment, the first contact part 601c includes a first portion and the second portion covered the first portion. The material of the first portion includes Ag/NiTi/TiW/Pt and the material of the second portion includes Ti/Al/Ti/Al/Cr/Pt sequentially formed on the semiconductor structure 1000c in a direction from the semiconductor stack 10c to the second pad 90c. In the embodiment, the second contact part 602c also includes a first portion and a second portion similar with the first contact part 601c. The material of the first portion and the second portion of the second contact part 602c can be the same with that of the first contact part 601c. In one embodiment, the reflective structure and the first contact part 601c include a same material with high reflectivity. The reflective structure and the second contact part 602c include a same material with high reflectivity. In one embodiment, the reflective structure, the first contact part 601c, and the second contact part 602c include silver.

In one embodiment, the light-emitting device 2c includes the second transparent conductive portion s20c and the third transparent conductive portion t30c between the contact layer 60c and the first semiconductor layer 101c, both of the first contact part 601c and the second contact part 602c including silver, and the adhesion layer 51c between the contact layer 60c and the second insulating structure 50c. Comparing with the light-emitting device 2c, the conventional light-emitting device is similar to the Sample C mentioned above and includes a first contact part without silver. For example, the material of the first contact part of the conventional light-emitting device includes Cr/Al/Cr/Al/Cr/Pt sequentially formed on a semiconductor structure 1000c. The light-emitting device 2c in the present embodiment has higher brightness caused by the first contact part 601c with silver to increase the reflective area of the light-emitting device 2c, and thus the brightness of the light-emitting device 2c could be enhanced. The brightness ($I_{\nu 2}$) of the conventional light-emitting device is 923.75 mW and the brightness ($I_{\nu 2}$) of the light-emitting device 2c in the embodiment is 965.83 mW. Therefore, the brightness of the light-emitting device 2c in the embodiment is increased by 4.56% higher than the conventional light-emitting device.

Figure 8:
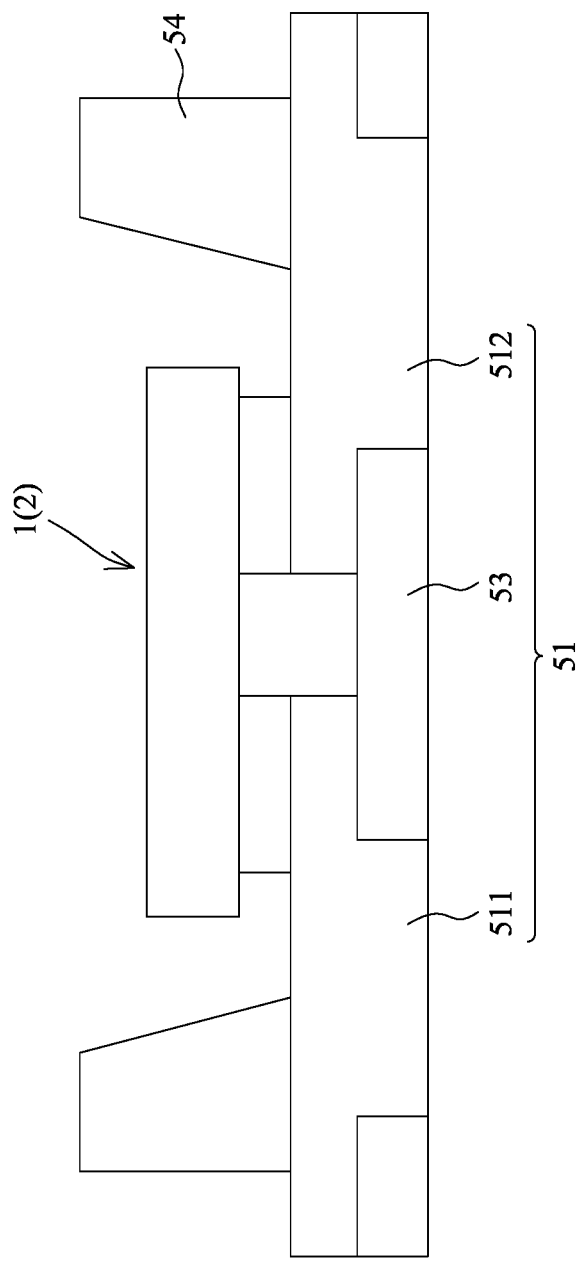
FIG. 8 illustrates a schematic view of a light-emitting apparatus 3 in accordance with an embodiment of the present application.

FIG. 8 is a schematic view of a light-emitting apparatus 3 in accordance with an embodiment of the present application. The light-emitting device can be selected from the foregoing embodiments, and is mounted on the first spacer 511 and the second spacer 512 of the package substrate 51 in the form of flip chip. The first spacer 511 and the second spacer 512 are electrically insulated from each other by an insulating portion 53 including an insulating material. The main light-extraction surface of the flip-chip is one side of the growth substrates opposite to the pad-forming surface. A reflective structure 54 can be provided around the light-emitting device to increase the light extraction efficiency of the light-emitting apparatus 3.

Figure 9:
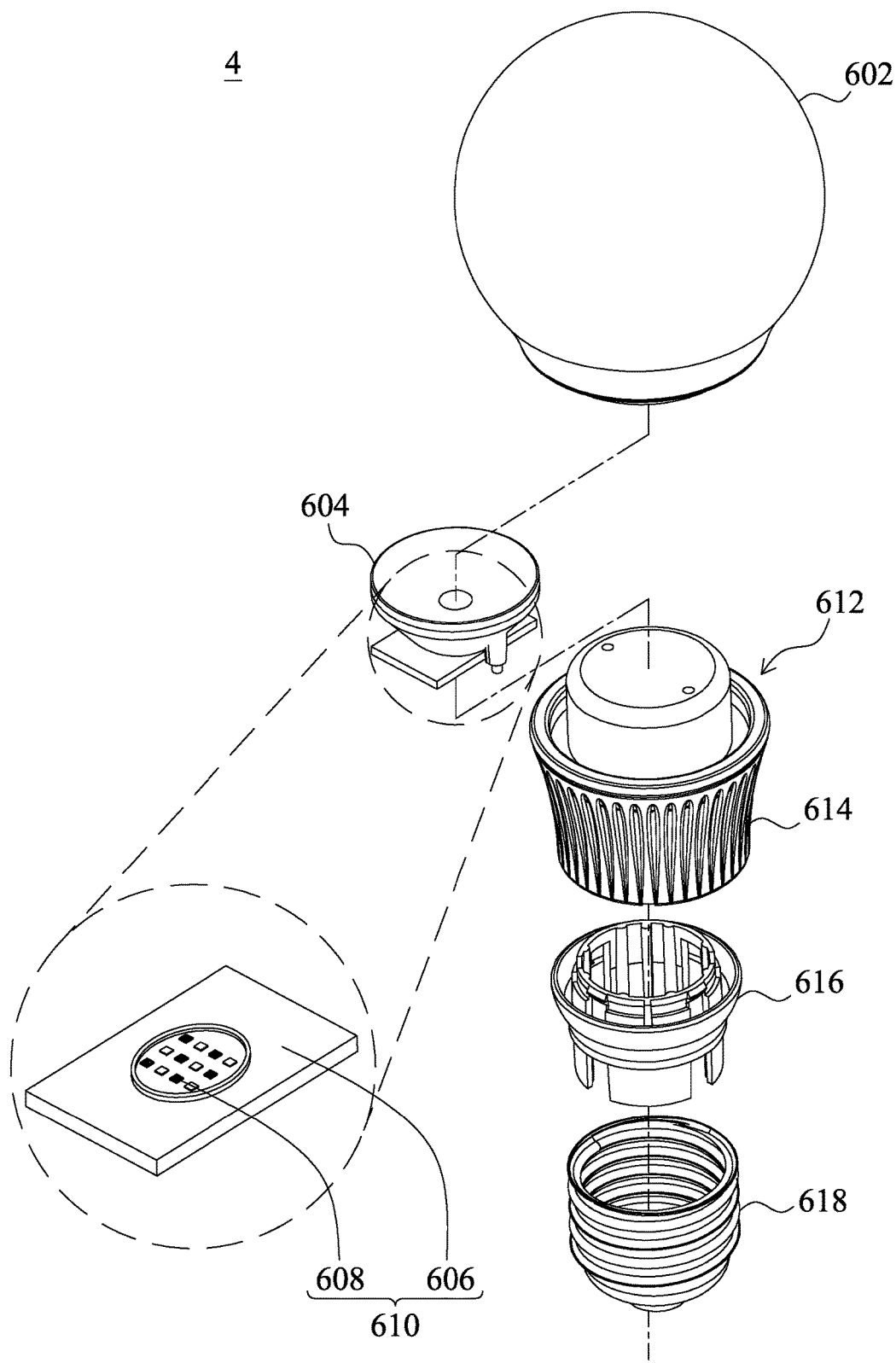
FIG. 9 illustrates a structure diagram of a light-emitting apparatus 4 in accordance with an embodiment of the present application.

FIG. 9 illustrates a structure diagram of a light-emitting apparatus 4 in accordance with an embodiment of the present application. A light bulb includes an envelope 602, a lens 604, a light-emitting module 610, a base 612, a heat sink 614, a connector 616 and an electrical connecting device 618. The light-emitting module 610 includes a submount 606 and a plurality of light-emitting devices 608 on the submount 606, wherein the plurality of light-emitting devices 608 can be the light-emitting devices or the light-emitting apparatus 3 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a semiconductor structure comprising a surface and a side wall inclined to the surface, wherein the semiconductor structure comprises a first semiconductor layer, a second semiconductor layer on the first semiconductor layer, and an active layer between the first semiconductor layer and the second semiconductor layer, and the second semiconductor layer comprises a first edge and a first area;
a reflective layer located on the second semiconductor layer and comprising an outer edge and a second area, wherein a distance between the first edge and the outer edge is between 0 μm and 10 μm, and the second area of the reflective layer is not less than 80% of the first area of the second semiconductor layer;
a first contact part comprising a metal formed on the reflective layer and the first semiconductor layer; and
a second contact part comprising a metal formed on the reflective layer, wherein the first contact part comprises a first periphery comprising a first periphery length larger than a periphery length of the active layer, and the second contact part comprises a second periphery surrounded by the first periphery of the first contact part from a top-view of the light-emitting device.

2. The light-emitting device of claim 1, further comprising a transparent conductive layer between the semiconductor structure and the reflective layer.

3. The light-emitting device of claim 2, wherein the transparent conductive layer comprises a first outer edge closer to the first edge of the second semiconductor layer than the outer edge of the reflective layer to the first edge of the second semiconductor layer, and the first outer edge of the transparent conductive layer is separated from the first edge of the second semiconductor layer.

4. The light-emitting device of claim 1, further comprising a first insulating structure on the surface and the side wall of the semiconductor structure,
wherein the first insulating structure on the surface of the semiconductor structure is between the second semiconductor layer and the reflective layer, and the reflective layer does not exceed the first edge of the second semiconductor layer and extend onto the side wall of the semiconductor structure.

5. The light-emitting device of claim 4, wherein the reflective layer covers a part of the first insulating structure.

6. The light-emitting device of claim 4, further comprising a substrate formed on the first semiconductor layer,
wherein the first insulating structure does not contact the substrate.

7. The light-emitting device of claim 4, further comprising a transparent conductive layer between the semiconductor structure and the reflective layer, wherein the transparent conductive layer covers the first insulating structure, and the transparent conductive layer does not exceed the first edge of the second semiconductor layer and extend onto the side wall of the semiconductor structure.

8. The light-emitting device of claim 1, wherein the reflective layer is located on the surface and devoid of extending to cover the side wall.

9. The light-emitting device of claim 2, wherein the transparent conductive layer is located on the surface and devoid of extending to cover the side wall.

10. The light-emitting device of claim 1, wherein the first edge of the second semiconductor layer surrounds the outer edge of the reflective layer.

11. A light-emitting device, comprising:
a semiconductor structure comprising a surface and a side wall inclined to the surface, wherein the semiconductor structure comprises a first semiconductor layer, a second semiconductor layer on the first semiconductor layer, and an active layer between the first semiconductor layer and the second semiconductor layer;
a first insulating structure located on the surface and the side wall of the semiconductor structure;
a reflective layer formed on the semiconductor structure, comprising a first reflective portion and a second reflective portion separated from the first reflective portion, wherein the first reflective portion is located on the second semiconductor layer and the second reflective portion is located on the first insulating structure; and
a gap formed between the first reflective portion and the second reflective portion, wherein the gap is formed on the second semiconductor layer and exposes the first insulating structure located on the second semiconductor layer, and the first reflective portion and the second reflective portion are electrically insulated from each other.

12. The light-emitting device of claim 11, wherein the second reflective portion extends onto the side wall.

13. The light-emitting device of claim 11, further comprising a transparent conductive layer formed on the semiconductor structure, wherein the transparent conductive layer comprises a first conductive portion and a second conductive portion separated from the first conductive portion, wherein the first conductive portion and the second conductive portion are located under the first reflective portion and the second reflective portion respectively.

14. The light-emitting device of claim 13, wherein the second conductive portion extends onto the side wall of the semiconductor structure.

15. A light-emitting device, comprising:
a semiconductor structure comprising a first semiconductor layer, a second semiconductor layer on the first semiconductor layer, and an active layer between the first semiconductor layer and the second semiconductor layer; wherein the semiconductor structure comprises an exposed part exposing the first semiconductor layer, and the exposed part is surrounded by the second semiconductor layer or surrounds the second semiconductor layer from a top view of the light-emitting device;

a second insulating layer covering the semiconductor structure;

a contact layer on the second insulating layer; and a transparent conductive layer comprising a first transparent conductive portion located on and electrically connected to the second semiconductor layer, and a second transparent conductive portion located on the exposed part and electrically connected to the first semiconductor layer, wherein the second transparent conductive portion is between the first semiconductor layer and the contact layer, the first transparent conductive portion is separated from the second transparent conductive portion, the first transparent conductive portion does not extend onto the exposed part, and the second transparent conductive portion does not extend onto the second semiconductor layer.

16. The light-emitting device of claim 15, wherein the contact layer comprises silver, the contact layer comprises a first contact part formed on the exposed part and the second semiconductor layer, and a second contact part formed on the second semiconductor layer, and the second contact part is surrounded by the first contact part from a top-view of the light-emitting device.

17. The light-emitting device of claim 15, further comprising an adhesion layer between the second insulating layer and the contact layer, wherein the adhesion layer extends onto the exposed part.

18. The light-emitting device of claim 17, wherein the adhesion layer comprises transparent conductive material or metal.

19. The light-emitting device of claim 17, wherein the adhesion layer connects to the second transparent conductive layer on the exposed part.

20. The light-emitting device of claim 15, wherein the second insulating layer includes a plurality of protrusions and a plurality of recesses on the exposed part, and the plurality of protrusions and the plurality of recesses are alternately arranged from the top-view of the light-emitting device.

* * * * *